United States Patent
Nuijten et al.

(10) Patent No.: US 7,868,711 B2
(45) Date of Patent: Jan. 11, 2011

(54) ARRANGEMENT FOR PULSE-WIDTH MODULATING AN INPUT SIGNAL

(75) Inventors: Petrus Antonius Cornelis Maria Nuijten, Eindhoven (NL); Lûtsen Ludgeras Albertus Hendrikus Dooper, Nijmegen (NL)

(73) Assignee: NXP B.V., Eindhoven (NL)

( * ) Notice: Subject to any disclaimer, the term of this patent is extended or adjusted under 35 U.S.C. 154(b) by 510 days.

(21) Appl. No.: 11/575,304

(22) PCT Filed: Sep. 9, 2005

(86) PCT No.: PCT/IB2005/052961

§ 371 (c)(1),
(2), (4) Date: Jan. 18, 2008

(87) PCT Pub. No.: WO2006/030363

PCT Pub. Date: Mar. 23, 2006

(65) Prior Publication Data

US 2008/0197935 A1      Aug. 21, 2008

(30) Foreign Application Priority Data

Sep. 14, 2004   (EP)   ................... 04104420

(51) Int. Cl.
*H03K 7/08* (2006.01)
(52) U.S. Cl. ................ 332/109; 332/107; 330/10; 375/238
(58) Field of Classification Search .......... 332/109, 332/107, 110; 330/10, 251, 207 A; 360/29; 375/238
See application file for complete search history.

(56) References Cited

U.S. PATENT DOCUMENTS

| 5,548,286 | A  | * | 8/1996 | Craven | .............. | 341/126 |
| 5,767,740 | A  |   | 6/1998 | Fogg |||
| 6,356,151 | B1 |   | 3/2002 | Nalbant |||
| 2003/0184376 | A1 |   | 10/2003 | Knoedgen |||
| 2006/0072657 | A1 | * | 4/2006 | Putzeys | .............. | 375/238 |

FOREIGN PATENT DOCUMENTS

| JP | 2003-264465 A | 9/2003 |
| WO | 03/043197 A | 5/2003 |

OTHER PUBLICATIONS

Gerzon, "Predistortion Techniques for Complex but Predictable Transmission Systems", Aug. 1972, JAES, vol. 20, Issue 6, pp. 475-482.*
M. O. J. Hawksford: "Dynamic Model-Based Linearization of Quantized Pulse-Width Modulation for Applications . . . "; Journal of Audio Engineering Society; vol. 40; Apr. 1992; pp. 235-252.

* cited by examiner

*Primary Examiner*—Robert Pascal
*Assistant Examiner*—Ryan Johnson

(57) ABSTRACT

An arrangement for pulse-width modulating an analog or digital input signal is provided. The non-linear distortion generated in the pulse-width modulator is precompensated by applying a signal with reversed error to the pulse-width modulator. The signal with reversed error is generated by a further pulse-width modulator that receives the input signal and whose output signal is subtracted from twice the input signal. The arrangement may e.g. be used to drive class D audio amplifiers.

3 Claims, 4 Drawing Sheets

ARRANGEMENT FOR PULSE-WIDTH MODULATING AN INPUT SIGNAL

BACKGROUND OF THE INVENTION

The invention relates to an arrangement for pulse-width modulating an input signal said arrangement comprising a pulse-width modulator and pre-compensation means connected in the input lead to the pulse-width modulator to pre-compensate for non-linear errors of said pulse-width modulator. Such arrangement is known from the article "Dynamic Model-Based Linearization of Quantized Pulse-Width Modulation for Applications in Digital-to-Analog Conversion and Digital Power Amplifier Systems" by M. O. J. Hawksford, Journal of Audio Engineering Society, Vol. 40, April 1992, pp. 235-252.

This arrangement may e.g. be used for driving class D audio power amplifiers. The class D technology enables high power audio amplifiers that are small enough to design stylish multi-channel audio systems. The input signal is delivered to the pulse-width modulator where the signal is converted into a two level pulse-width modulated signal (with levels 0 and 1) or a three level pulse-width modulated signal (with levels −1, 0 and +1) with a switching frequency that is substantially higher than the highest audio frequency. The pulse-width modulated signal may drive C-MOS switches that in turn drive a loudspeaker through an LC filter for substantially removing the high switching-frequency signal components from the loudspeaker. The class D amplifier has high power-efficiency because the power losses in the switches and in the LC-filter are relatively small.

A problem however is that pulse-width modulation is inherently a non linear operation especially for higher modulation indices, with the result that the pulse-width modulated output signal is subjected to non linear distortion. This non-linearity is caused by the fact that the frequency spectrum of each individual pulse is dynamically modified as a function of the pulse-width. The subsequent summation over all pulses results in a dynamic spectral modulation that is the root of the non-linearity. The above-identified article seeks to pre-compensate the non-linear distortion of the pulse-width modulator by subjecting the input data of the pulse-width modulator to finite impulse response filters whose coefficients shift with the input data. This results in a very complex realization and a reduction of the non-linear distortion by only about 10 dB.

BRIEF SUMMARY OF THE INVENTION

The present invention seeks to pre-compensate for the non-linear distortion of a pulse-width modulator with a less complicated and more effective implementation and the arrangement according to the present invention is therefore characterized in that the pre-compensation means comprise a further pulse-width modulator that is substantially identical to the first mentioned pulse-width modulator and that is connected to receive the input signal, subtracting means for subtracting, for the baseband frequencies of the input signal, the output of the further pulse-width modulator from twice the input signal and means to supply the output of the subtracting means to the input of the first mentioned pulse-width modulator.

The basic idea of the invention is that an input signal S is firstly applied to a pulse-width modulator to produce a distorted output signal S+$\epsilon$ that, for the frequency band of interest, is composed of a clean part S that equals the input signal, and an error signal $\epsilon$ that is added to the signal by the pulse-width modulator. The subtracting means subtract this signal S+$\epsilon$ from twice the input signal (2S) so that a distorted signal S−$\epsilon$ is obtained that is distorted with the inverse of the original distortion. This distorted signal is again subjected to a pulse-width modulation and the error signal $\epsilon$ of this pulse-width modulation substantially cancels against the inverted error of its input signal.

The invention may be applied with analog input signal and analog pulse-width modulators as well as with digital input signal and digital pulse-width modulators. It has been found that in analog implementation the non-linearity of the pulse-width modulator becomes manifest when the modulation index of the signal is about 95% or larger. In contradistinction therewith the non-linearity of digital pulse-width modulators becomes manifest at much lower modulation indices.

It may be noted that a digital pulse-width modulator may convert each n-bit word of a digitally coded input signal into a plurality of $2^n$ one-bit samples of which an—input signal dependent—contiguous number has one bit-value whilst the also contiguous rest of the samples has the other bit-value. Therefore the plurality of $2^n$ samples represents a width-modulated pulse with $2^n$ possible flank-positions.

It is a further object of the invention to provide an arrangement for pulse-width modulating a digitally coded input signal and such arrangement is in particular characterized in that both said pulse-width modulators are digital pulse-width modulators whose output signal has a sampling rate that is larger than that of the input signal, and that the output signal of said further pulse-width modulator is subjected to a decimator that reduces the sample rate to that of the digitally coded input signal. Whereas the output of the first mentioned digital pulse-width modulator is applied (either directly or trough a DA converter) to the output of the arrangement, the output of the further digital pulse-width modulator is applied to a decimator that converts the $2^n$ samples into a single multi-bit word for combination with the multi-bit input signal word. With other words: because one multi-bit input sample results in a plurality of one-bit samples in the output signal, the digital output signal of the further pulse-width modulator is, prior to its combination with twice the input signal to constitute the distorted signal S−$\epsilon$, applied to a decimator to make the sample rate of this output signal equal to that of the input signal.

Often, the digitally coded (audio) input signal has a sample rate that is too low and a word-length that is too large for direct application to a digital pulse-width modulator as explained above. The sample rate of the input signal is often just a little more than two times the highest base band frequency whilst the rate of the width-modulated output pulses has to be many times higher than the highest base band frequency. For this reason the digital input signal, prior to its application to the further pulse-width modulator, may be subjected to an interpolator (up-sampler) to increase the sample rate.

If the (up-sampled) input signal would be directly applied to the pulse-width modulator, the large word-length of the signal would result in much too many possible flank positions of the output signal of the modulator. Therefore it is usual practice to insert a multi-bit digital noise shaper ($\Sigma\Delta$-modulator) in the input lead to the pulse-width modulator. This noise shaper substantially reduces the word length of the signal while simultaneously the quantization noise that is inherent to the word length reduction is shaped to higher frequencies outside the frequency band of interest. The arrangement of the present invention wherein a noise shaper precedes the first mentioned digital pulse-width modulator is further characterized in that a further digital noise shaper that is substantially identical to the first mentioned digital noise shaper precedes the further digital pulse-width modulator. In this way it is ascertained that the combination of the first noise shaper and the first mentioned pulse-width modulator generates an error signal that is substantially equal in the base band to the error signal generated by the combination of further noise shaper and further pulse-width modulator.

BRIEF DESCRIPTION OF THE DRAWING

The invention will be described with reference to the accompanying Figures. Herein shows.

DETAILED DESCRIPTION OF THE INVENTION

Figure 1:
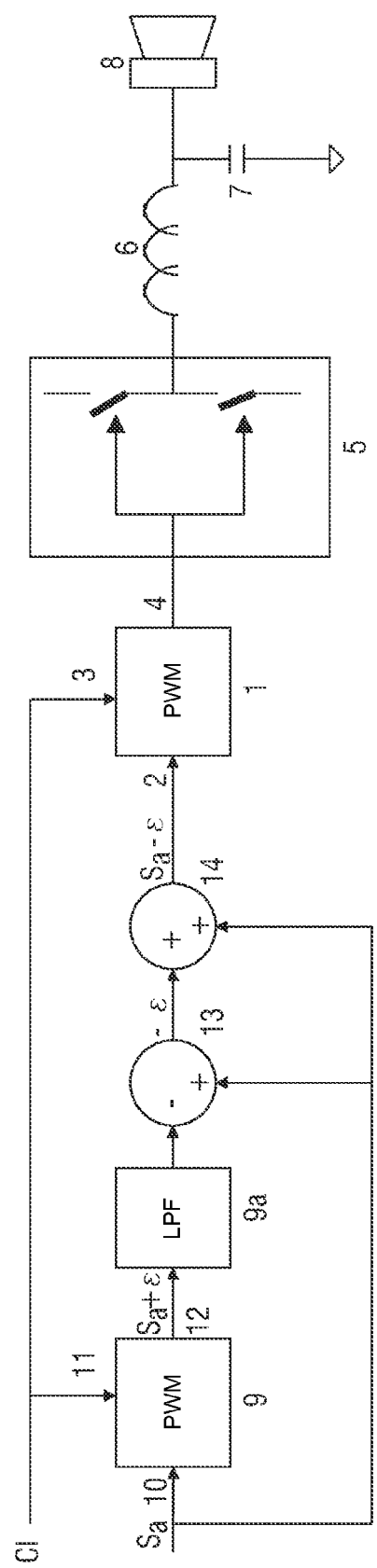
FIG. 1 an arrangement for pulse-width modulating analog signals in accordance with the invention, FIG. 2 an arrangement for pulse-width modulating digital signals in accordance with the invention, FIG. 3 a second arrangement for pulse-width modulating digital signals in accordance with the invention and FIG. 4 spectral graphs illustrating the benefits of the present invention with an arrangement as shown in FIG. 3.

The arrangement of FIG. 1 comprises a state of the art analog pulse-width modulator 1 with an input terminal 2 for an analog input signal, a clock pulse input 3 for receiving clock pulses Cl and an output terminal 4 for delivering a pulse train that has a uniform clock controlled pulse frequency and a pulse-width that varies with the level of the input signal. The pulse frequency is substantially higher than the highest frequency of the input signal. E.g. in case of an audio signal of 50-20000 Hz the pulse frequency may be 300 kHz to 10 MHz. The pulse-width modulated signal at the output terminal 4 is used to drive a state of the art class D power output amplifier 5. The power output pulses are applied to a LC low pass filter comprising an inductor 6 and a capacitor 7 and the so low pass filtered signal drives a loudspeaker 8.

The low frequency content of the output signal of the pulse-width modulator 1 should as much as possible be equal to the input signal of this modulator. However, as mentioned in the introductory part to this application, the pulse-width modulator is inherently a non-linear element that introduces non-linear distortion such as second and third harmonic distortion, especially at higher modulation indices of the input signal. Consequently, when the input signal of the pulse-width modulator 1 is denoted by Sa, the low frequency content of the output pulse train of the modulator may be denoted by Sa+ϵ where ϵ represents the distortion introduced by the modulator 1.

To reduce this distortion the input signal Sa is not applied to the input terminal of the pulse-width modulator 1 but to the input terminal of a further pulse-width modulator 9. This further pulse-width modulator also has a clock pulse input 11 receiving the clock pulses Cl, an output terminal 12 for delivering a train of width modulated pulses and is further as much as reasonably possible equal in construction to the pulse-width modulator 1. The result is that the low frequency content of the output pulses is Sa+ϵ, i.e. substantially equal to the output signal of the pulse-width modulator 1 if the input signal Sa would have been applied to the input thereof.

The output signal Sa+ϵ of the pulse-width modulator 9 is applied, through a low pass filter 9a that leaves the baseband signal Sa+ϵ substantially unaltered but that removes the pulsating character of the signal, to a subtracter 13 where this signal is subtracted from the input signal Sa, so that at the output of the subtracter the distortion−ϵ appears isolated and reversed with respect to the distortion in the output signal of the modulator 9. Subsequently this isolated and reversed distortion is added to the input signal Sa in an adder 14 to obtain the input signal with reversed distortion Sa−ϵ and finally this distorted signal is applied to the input terminal 2 of the pulse-width modulator 1. Because in this signal the signal component Sa dominates over the distortion component−ϵ, the pulse-width modulator 1 will substantially generate a distortion ϵ that cancels against the reversed distortion−ϵ in its input signal, so that at the output of the pulse-width modulator 1 a signal with substantially reduced distortion results. With other words: the further pulse-width modulator 9 and the subtracting means 13, 14 generate a distortion that substantially pre-compensates the distortion generated by the pulse-width modulator 1.

It may be noted that alternatively the subtracter 13 may subtract the input signal Sa from the output signal Sa+ϵ of the pulse-width modulator 9 to generate the isolated but non reversed error signal ϵ and that in stead of the adder 14 a second subtracter is used to subtract the error signal ϵ from the input signal Sa to generate the signal Sa−ϵ. It is also noted that the adder 14 may be dispensed with if the subtracter 13 receives twice the input signal (2Sa). However, this would imply the introduction of an analog amplifier with factor 2 in the input lead to the + input of the subtracter 13 with the risk of additional non-linear distortion.

Figure 2:
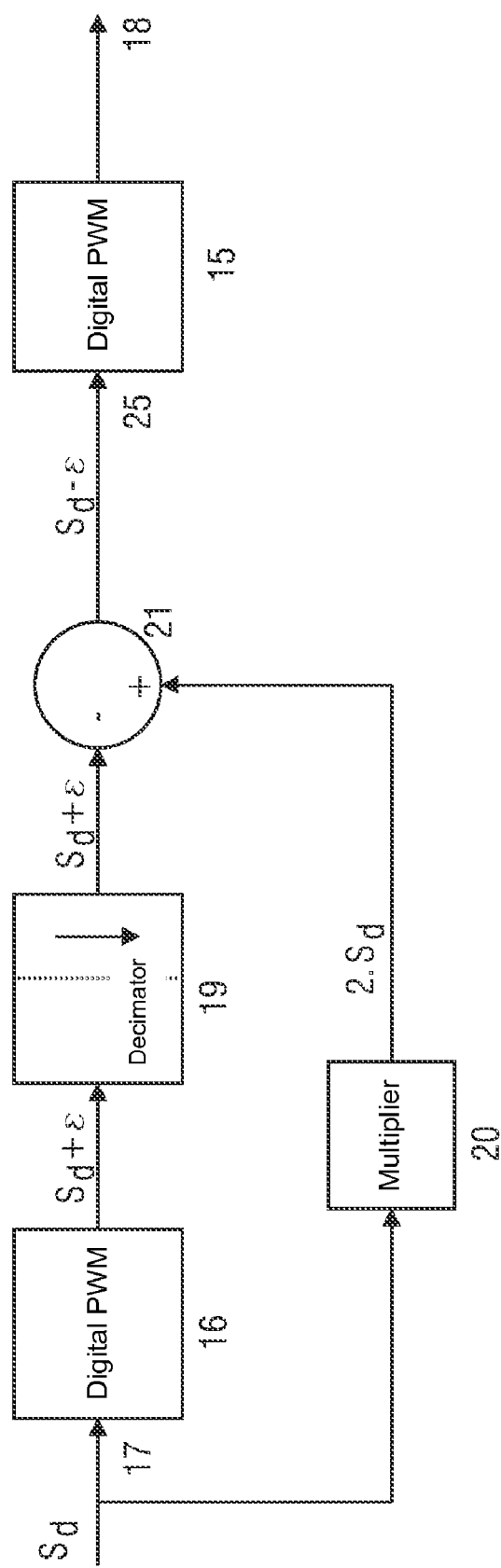

The arrangement of FIG. 2 comprises a digital pulse-width modulator 15 and is intended to convert a digitally coded input signal Sd. A further digital pulse-width modulator 16 reduces the non-linear distortion introduced by the modulator 15. The principle of the distortion reduction is the same as that explained with reference to FIG. 1 for analog signals. It is noted that the distortion reduction obtained in the arrangement of FIG. 2 is more necessary because the non-linear distortion in a digital pulse-width modulator is larger than in an analog pulse-width modulator. The distortion reduction is also more effective because in a digital pulse-width modulation arrangement there is more distortion to be compensated. Moreover in a digital implementation the signal operations are exactly defined and can therefore be easier made identical.

A digitally coded input signal Sd with a sampling rate $f_u$ and a word-length n is applied to an input 17 of the further digital pulse-width modulator 16. The pulse-width modulator 16 converts each n-bit input word to a fixed train of $2^n$ one-bit samples, so that the sample rate of the output signal is $2^n \cdot f_u$. Each such train of $2^n$ one-bit samples comprises a contiguous set of samples of one value (e.g. "1") whose number is equal to the value of the n-bit input word. The remaining samples of the train of $2^n$ pulses are also contiguous and have the other value ("0"). The same applies to the output of the digital pulse-width modulator 15.

The output pulses of the pulse-width modulator 16 with sample rate $2^n \cdot f_u$ are applied to a decimator 19, which reduces the sample rate to the sample rate $f_u$ of the input signal Sd. The decimator 19 comprises a low pass filter section to prevent higher frequencies of the signal to fold back into the (audio) base band, and a section that actually deletes the undesired samples. The output signal of the decimator is a digitally coded multi-bit signal of sample rate $f_u$. The base band signal hereof may be represented by Sd+ϵ wherein ϵ represents the base band distortion introduced by the pulse-width modulator 16.

The input signal Sd is multiplied by 2 in a multiplier 20. In the digital implementation of the arrangement of FIG. 2 this is done simply and accurately by increasing each digital word of the signal by one less significant zero bit. Subsequently the output signal Sd+ϵ with sample rate $f_u$ is subtracted from the output signal 2·Sd of the multiplier 20 in a subtracter 21 and the result of this subtraction 2·Sd−(Sd+ϵ)=Sd−ϵ is applied to the input 25 of the pulse-width modulator 15. As already explained with reference to FIG. 1, the distortion generated within the pulse-width modulator 15 is then substantially pre-compensated by the reversed distortion in the input signal of the pulse-width modulator 15.

Figure 3:
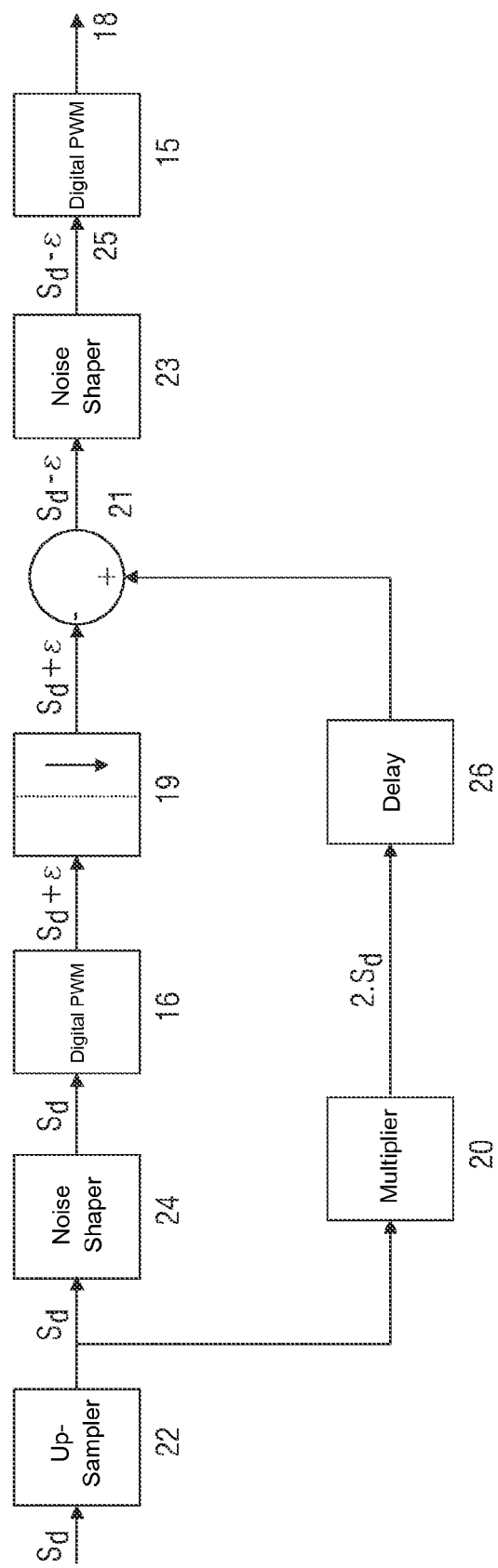

The following paragraphs describe the arrangement shown in FIG. 3. In this Figure the elements corresponding to those of FIG. 2 have been given the same reference numerals.

In the arrangement of FIG. 2 the rate $f_u$ of the pulse-width modulated pulses at the output 18 is equal to the sample rate of the digitally coded input signal Sd applied to the input 17. Often in practice the sample rate of the signal to be modulated is only slightly larger than twice the highest signal frequency, which is too less for the pulse rate of the pulse-width modulated output signal. E.g. for audio applications the sample rate $f_s$ is often 44.1 kHz while the pulse rate of the pulse-width modulated output signal should be larger than 2.5 MHz. In the arrangement of FIG. 3 this is solved by the insertion of an up-sampler 22 in the input lead of the arrangement. For audio applications the up-sample ratio may then e.g. be equal to 16 giving an up-sampled rate $f_u$ of 16×44.1 kHz=705.6 kHz.

A further restriction of the arrangement of FIG. 2 is that the word-length n of the input signal determines the number of one-bit samples $2^n$ that make up one width-modulated pulse in the output and this gives often a much too high value. With a usual audio word-length of 20 bits the number of one-bit samples making one single output pulse would be $2^{20}=1048576$. A standard method to solve this problem is to use a multi-bit ΣΔ-modulator 23 in front of the pulse-width modulator 15. Then, in accordance with the invention an identical multi-bit ΣΔ-modulator 24 is placed in front of the pulse-width modulator 16. These ΣΔ-modulators operate as word-length reducers converting the input word-length of e.g. 20 bit to an output word-length of e.g. n=6 bit, so that the number $2^n$ of samples that make one pulse of the output signal is reduced to a reasonable value of $2^n=64$. As is well known the advantage of using a ΣΔ-modulator for the word-length reduction is that the quantization noise that is inherent to word-length reduction is shaped to higher frequencies above the frequency band of interest.

As is already noted the pulse-width modulators 15 and 16 are preferably made exactly equal to each other and the same applies to the noise shapers (ΣΔ-modulators) 23 and 24, so as to make the error pre-compensation as effective as possible. For the same reason the arrangement of FIG. 3 comprises a digital delay 26 that compensates for the delay of the noise shaper 24, the pulse-width modulator 16 and the decimator 19. A similar delay may be inserted in FIG. 2 in the input lead or output lead of the multiplier 20 to compensate for the delay of the pulse-width modulator 16 and the decimator 19.

FIG. 4 shows some spectral graphs illustrating the effectiveness of the arrangement according to the invention in case a digitally coded sinusoidal input signal of 1.3 kHz is applied to the arrangement of FIG. 3.

Figure 4A:
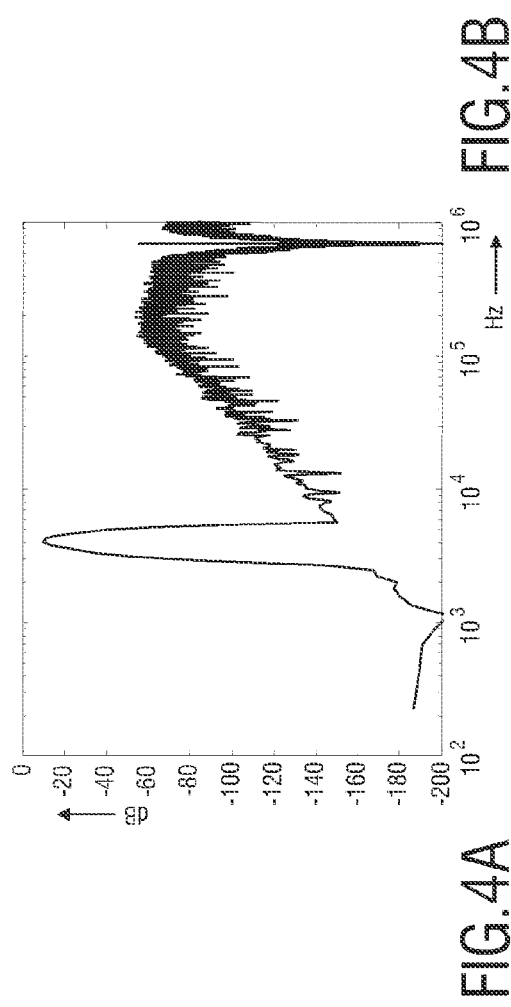

FIG. 4a shows the spectrum of the clean input signal Sd.

Figure 4B:
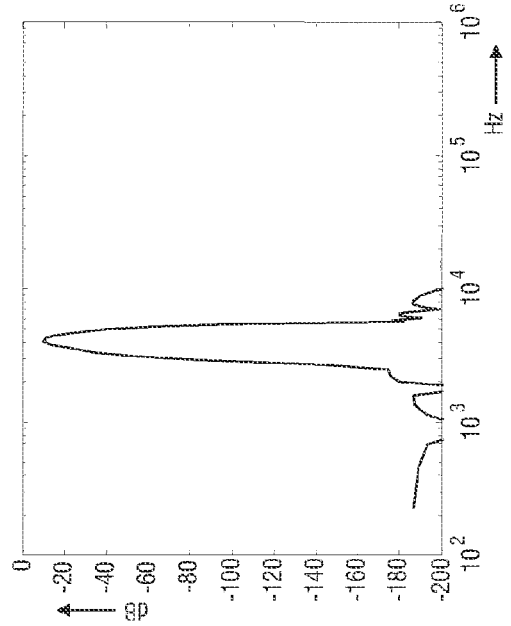

FIG. 4b shows the spectrum of the output signal of the noise shaper 23 when the clean input signal Sd is applied to the input of this noise shaper. The quantization noise that is shaped to higher frequencies is clearly visible. The signal to noise ratio in the audio frequency band is about 100.3 dB.

Figure 4C:
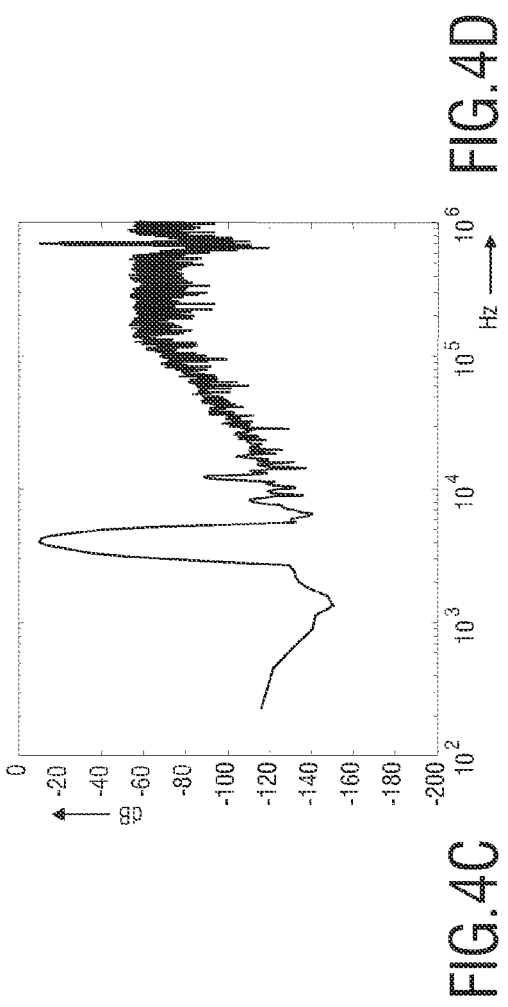

FIG. 4c shows the spectrum of the output signal of the pulse-width modulator 15, again with the clean input signal Sd applied to the input of the noise shaper 23, so that no pre-compensation is applied. There is large signal degradation due to the non-linear pulse-width modulation. Especially the second and third harmonic distortions are clearly visible. The total harmonic distortion in the audio frequency band has then increased to −43.8 dB.

Figure 4D:
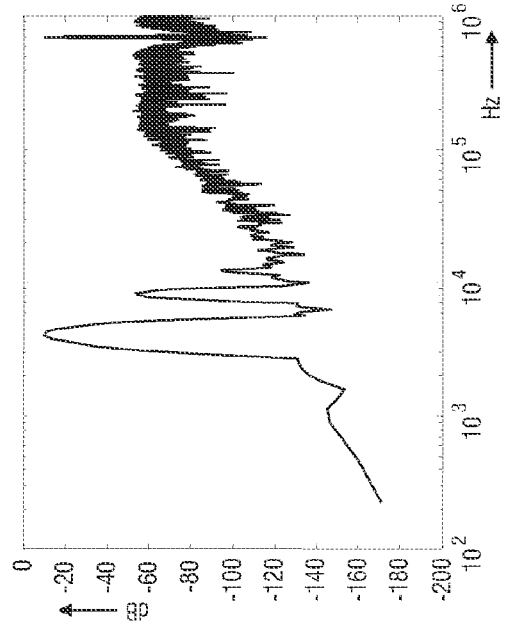

FIG. 4d shows the spectrum of the output signal of the pulse-width modulator 15 with the clean input signal Sd applied to the input of the noise shaper 24. In this case the pre-compensation is active. The non-linear distortion, especially the second harmonic distortion is substantially reduced. The total harmonic distortion in the audio frequency band is now −78.2 dB.

The embodiments of the present invention shown in the Figures and described above are intended to be taken in an illustrative and not a limiting sense. Those skilled in the art may make various modifications to these embodiments without departing from the scope of the present invention as defined in the appended claims. For example: in FIG. 1 the low pass filter 9a may be placed in the output lead of the subtracter 13 or in the output lead of the adder 14 in stead of in the output lead of the pulse-width modulator 12. Also in FIG. 3 the signal to the + input of the subtracter 21 may be taken wholly or partly from the output of the noise shaper 24, provided that a low pass filter is used to reduce the high frequency quantization noise that is present in this signal.

The invention claimed is:

1. Arrangement for pulse-width modulating an input signal said arrangement comprising a pulse-width modulator and pre-compensation means connected in the input lead to the pulse-width modulator to pre-compensate for non-linear errors of said pulse-width modulator, characterized in that the pre-compensation means comprise a further pulse-width modulator that is substantially identical to the first mentioned pulse-width modulator and that is connected to receive the input signal, subtracting means for subtracting, for the baseband frequencies of the input signal, the output of the further pulse-width modulator from twice the input signal and means to supply the output of the subtracting means to the input of the first mentioned pulse-width modulator.

2. Arrangement as claimed in claim 1 for pulse-width modulating a digitally coded input signal, characterized in that both said pulse-width modulators are digital pulse-width modulators whose output signal has a sample rate that is larger than that of the input signal, and that the output signal of said further pulse-width modulator is subjected to a decimator that reduces the sample rate to that of the digitally coded input signal.

3. Arrangement as claimed in claim 2 wherein a multi-bit digital noise shaper precedes the first mentioned digital pulse-width modulator characterized in that a further multi-bit digital noise shaper that is substantially identical to the first mentioned digital noise shaper precedes the further digital pulse-width modulator.

* * * * *